(12) United States Patent
Kim

(10) Patent No.: US 7,479,797 B2
(45) Date of Patent: Jan. 20, 2009

(54) TDDB TEST PATTERN AND METHOD FOR TESTING TDDB OF MOS CAPACITOR DIELECTRIC

(75) Inventor: Ha Zoong Kim, Kyonggi-do (KR)

(73) Assignee: LG Semicon Co., Ltd., Cheongju-Si, Chungcheongbuk-Do (KR)

( * ) Notice: Subject to any disclaimer, the term of this patent is extended or adjusted under 35 U.S.C. 154(b) by 18 days.

(21) Appl. No.: 11/643,656

(22) Filed: Dec. 22, 2006

(65) Prior Publication Data

US 2007/0103184 A1    May 10, 2007

Related U.S. Application Data

(62) Division of application No. 10/895,285, filed on Jul. 21, 2004, now Pat. No. 7,170,309, which is a division of application No. 09/995,680, filed on Nov. 29, 2001, now Pat. No. 6,781,401, which is a division of application No. 09/342,514, filed on Jun. 29, 1999, now Pat. No. 6,351,135.

(30) Foreign Application Priority Data

Aug. 31, 1998   (KR)   ................................... 98-35677
Jan. 12, 1999   (KR)   ................................... 1999-568

(51) Int. Cl.
   *G01R 31/28*   (2006.01)
   *G01R 31/14*   (2006.01)
(52) U.S. Cl. ........................ 324/765; 324/551
(58) Field of Classification Search ................ 324/551, 324/554, 719, 754–769
   See application file for complete search history.

(56) References Cited

U.S. PATENT DOCUMENTS

| | | |
|---|---|---|
| 3,833,865 A | 9/1974 | Palmer |
| 3,883,825 A | 5/1975 | Cohen |
| 3,919,668 A | 11/1975 | Minami et al. |
| 4,571,505 A | 2/1986 | Eaton, Jr. |
| 4,904,946 A | 2/1990 | Hirai et al. |
| 4,922,135 A | 5/1990 | Mollier et al. |
| 5,049,841 A | 9/1991 | Cooper et al. |
| 5,220,306 A | 6/1993 | Shimizu et al. |
| 5,420,513 A | 5/1995 | Kimura et al. |
| 5,610,429 A | 3/1997 | Crafts |
| 5,612,917 A | 3/1997 | Kozaru et al. |

(Continued)

*Primary Examiner*—Ernest F Karlsen
(74) *Attorney, Agent, or Firm*—Birch, Stewart, Kolasch & Birch, LLP

(57) ABSTRACT

A Time Dependent Dielectric Breakdown (TDDB) test pattern circuit, which can reduce testing time and statistically improve a precision of measurement as well as a method for testing the test pattern circuit are discussed. Typically, a test pattern circuit includes in plurality of unit test patterns. Each unit test pattern includes a capacitor connected to a stress voltage. The stress voltage is applied to the capacitor and the current flowing from the capacitor is measured over time. The dielectric in the capacitor breaks down over time and at a certain point, the current from the capacitor changes suddenly. Unfortunately, the convention test pattern circuit requires serial testing of each unit cell, and therefore, the measuring time is significant when there are many unit cells involved. The circuit allows for the measurements to take place simultaneously for all unit cells within the test pattern circuit. This greatly reduces the testing time, allows for greater amount of data to be obtained which improves the statistically accuracy, and reduces costs as well.

5 Claims, 6 Drawing Sheets

U.S. PATENT DOCUMENTS

| | | |
|---|---|---|
| 5,621,629 A | 4/1997 | Hemminger et al. |
| 5,625,218 A | 4/1997 | Yamadera et al. |
| 5,654,588 A | 8/1997 | Dasse et al. |
| 5,777,931 A * | 7/1998 | Kwon et al. ............... 365/200 |
| 5,841,164 A | 11/1998 | Tsujino et al. |
| 5,886,363 A | 3/1999 | Hamada et al. |
| 6,067,597 A | 5/2000 | Kozaru et al. |
| 6,115,283 A | 9/2000 | Hidaka et al. |
| 6,249,410 B1 | 6/2001 | Ker et al. |

\* cited by examiner

US 7,479,797 B2

TDDB TEST PATTERN AND METHOD FOR TESTING TDDB OF MOS CAPACITOR DIELECTRIC

CROSS REFERENCE TO RELATED APPLICATIONS

This application is a Divisional of application Ser. No. 10/895,285 filed on Jul. 21, 2004, now U.S. Pat. No. 7,170,309, which in turn is a Divisional of Ser. No. 09/995,680, filed on Nov. 29, 2001, now U.S. Pat. No. 6,781,401, which in turn is a Divisional of application Ser. No. 09/342,514, filed on Jun. 29, 1999, now U.S. Pat. No. 6,351,135 B1, dated Feb. 26, 2002, and for which priority is claimed under 35 U.S.C. § 120; and this application claims priority of Application No. 35677/1998 filed in Korea on Aug. 31, 1998 and Application No. 568/1999 filed in Korea on Jan. 12, 1999 under 35 U.S.C. § 119; the entire contents of all are hereby incorporated by reference.

BACKGROUND OF THE INVENTION

Field of the Invention

The present invention relates to a TDDB (Time Dependent Dielectric Breakdown) test pattern circuit, and more particularly, to a TDDB test pattern circuit which can reduce a test time period and improve a precision of a measurement result statistically; and a method for testing TDDBs of MOS capacitor dielectric films using the same.

A related art TDDB test pattern and a method for testing TDDBs of MOS capacitor dielectric films using the same will be explained. FIG. 1 illustrates a unit circuit showing a related art TDDB test pattern circuit, and FIG. 2 illustrates a graph showing an experimental data of TDDB of an MOS capacitor dielectric film measured using FIG. 1.

Referring to FIG. 1, the related art TDDB test pattern circuit includes an MOS capacitor 1 having one electrode grounded and a voltage application electrode 2 for applying a constant voltage $V_{force}$ to the other electrode on the MOS capacitor 1. And, there is an ammeter 3 between the MOS capacitor 1 and the voltage application electrode 2 for measuring a current to the MOS capacitor 1.

A related art method for testing the TDDB test pattern circuit will be explained. One side of electrode of the MOS capacitor 1 is grounded, the other side of the electrode is applied of a constant stress voltage of Vforce, and current to the MOS capacitor is measured through the ammeter 3.

FIG. 2 illustrates an example of current to the MOS capacitor along time measured according to the above method, wherein it can be seen that there is a sudden increase of the current time of 340 seconds from an application of the voltage stress to the MOS capacitor 1. This time period of 340 seconds is the Tbd(Time to breakdown) of the MOS capacitor 1. In order to measure a Tbd of each MOS capacitor in N unit test pattern cells according to the test method of the related art TDDB test pattern circuit, a test for each of the N test pattern cells is required, i.e., N tests are required. And, if it is assumed that an average time period taken until an MOS capacitor dielectric film in a unit test pattern cell is Tavg, the total time required for measuring a Tbd of each MOS capacitor dielectric film in N unit test pattern cells is NxTavg.

The related art TDDB test pattern circuit and a method for testing TDDBs of MOS capacitor dielectric films using the same has the following problems.

Significant time period is required for Tbd testing N number of unit test pattern cells, and the use of a testing equipment for a prolonged time period costs high.

SUMMARY OF THE INVENTION

Accordingly, the present invention is directed to a TDDB test pattern circuit and a method for testing TDDBs of MOS capacitor dielectric films using the same that substantially obviates one or more of the problems due to limitations and disadvantages of the related art.

An object of the present invention is to provide a TDDB test pattern circuit and a method for testing TDDBs of MOS capacitor dielectric films using the same, which can shorten a time period required for a test as well as a time period for using a measuring equipment required for the test and reduce a measuring cost.

Another object of the present invention is to provide a TDDB test pattern circuit and a method for testing TDDBs of MOS capacitor dielectric films using the same, which allows to obtain much more test data within the same time period, thereby improving a precision of a measuring result in view of statistics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the TDDB test pattern circuit includes a plurality of unit test pattern cells each having an MOS capacitor, an MOS transistor, and a fuse for controlling operations of the MOS capacitor and the MOS transistor, a first voltage supplying unit for supplying a stress voltage to the MOS capacitor and the MOS transistor in each unit test pattern cell on the same time, an ammeter for continuous measurement of a total current from the plurality of unit test pattern cells, to measure a total time to breakdown of the plurality of unit test pattern cells, a plurality of VFN's(Voltage Forcing Nodes) each positioned between the first voltage supplying unit and the fuse in the unit test pattern cell, a DCMN(Drain Current Measuring Node) positioned between the ammeter and a drain terminal of the MOS transistor in each of the plurality of unit test pattern cells, and a second voltage supplying unit for applying a voltage to the drain terminal of the MOS transistor.

In other aspect of the present invention, there is provided A method for testing TDDBs of MOS capacitor dielectric films using a TDDB test pattern circuit, including the steps of (1) applying a stress voltage to an input electrode on each of an MOS capacitor and an MOS transistor in each of a plurality of unit test pattern cells from a first voltage supplying unit, and applying a voltage to a drain electrode of the MOS transistor from a second voltage supplying unit, (2) measuring a total drain current from the MOS transistor in each of the plurality of unit test pattern cells, to which the stress voltage is applied, and (3) measuring a last change of the total drain current from the MOS transistor in the plurality of unit test pattern cells, to measure a maximum time to breakdown of a plurality of MOS capacitor dielectric films in the plurality of unit test pattern cells.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENT

Figure 3:
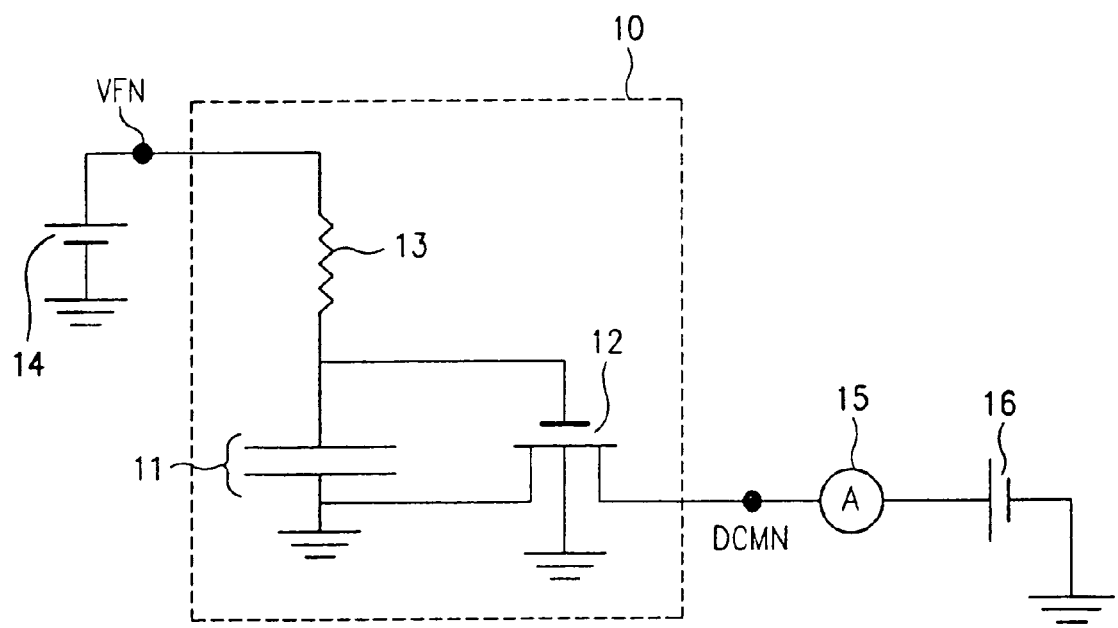
FIG. 3 illustrates a unit circuit showing a TDDB test pattern circuit using a unit test pattern cell in accordance with a preferred embodiment of the present invention.
Figure 4:
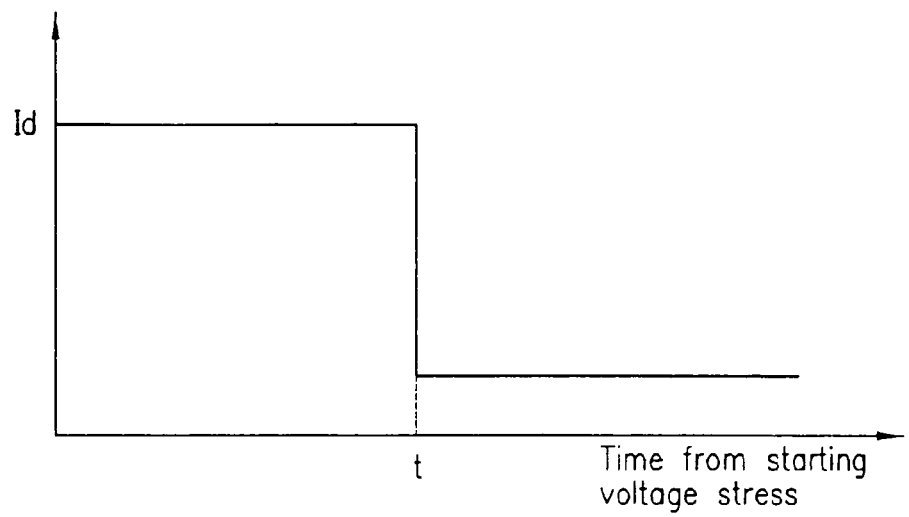
FIG. 4 illustrates a graph showing an experimental data of TDDB of an MOS capacitor dielectric film measured using FIG. 3.

Reference will now be made in detail to the preferred embodiments of the present invention, examples of which are illustrated in the accompanying drawings. FIG. 3 illustrates a unit circuit showing a TDDB test pattern circuit in accordance with a preferred embodiment of the present invention, FIG. 4 illustrates a graph showing an experimental data of TDDB of an MOS capacitor dielectric film measured using FIG. 3, FIG. 5 illustrates an entire circuit showing a TDDB test pattern circuit of the present invention, and FIG. 6 illustrates a graph showing an experimental data of TDDB of an MOS capacitor dielectric film measured using FIG. 5.

Referring to FIG. 3, the unit circuit showing a TDDB test pattern circuit of the present invention includes a unit test pattern cell 10, a constant voltage applying electrode 14 for applying a constant voltage to the unit test pattern cell 10, an ammeter 15 for measuring a current to the unit test pattern cell 10, and a drain voltage applying electrode 16 for applying a voltage to the unit test pattern cell 10. The unit test pattern cell 10 includes a MOS capacitor 11 and a MOS transistor 12 operates in response to the voltage from the constant voltage applying electrode 14, and a fuse 13 for controlling operation of the MOS capacitor 11 and the MOS transistor 12 if an excessive current flows from the constant voltage applying electrode 14. The MOS capacitor has two electrodes and a dielectric film formed between the two electrodes. The fuse 13 may be a metal line having a width smaller than a wiring metal line for providing a resistance higher than the wiring metal line. The MOS transistor 12 has a gate oxide film, a gate electrode, and a source electrode and a drain electrode.

Here, the constant voltage applying electrode 14, the current meter 15, and the drain voltage applying electrode 16 are components contained in a measuring equipment for the test. There is a constant VFN (Voltage Forcing Node) between the constant voltage applying electrode 14 and the unit test pattern cell 10, and a DCMN(Drain Current Measuring Node) between the MOS transistor 12 and the ammeter 15.

Figure 5:
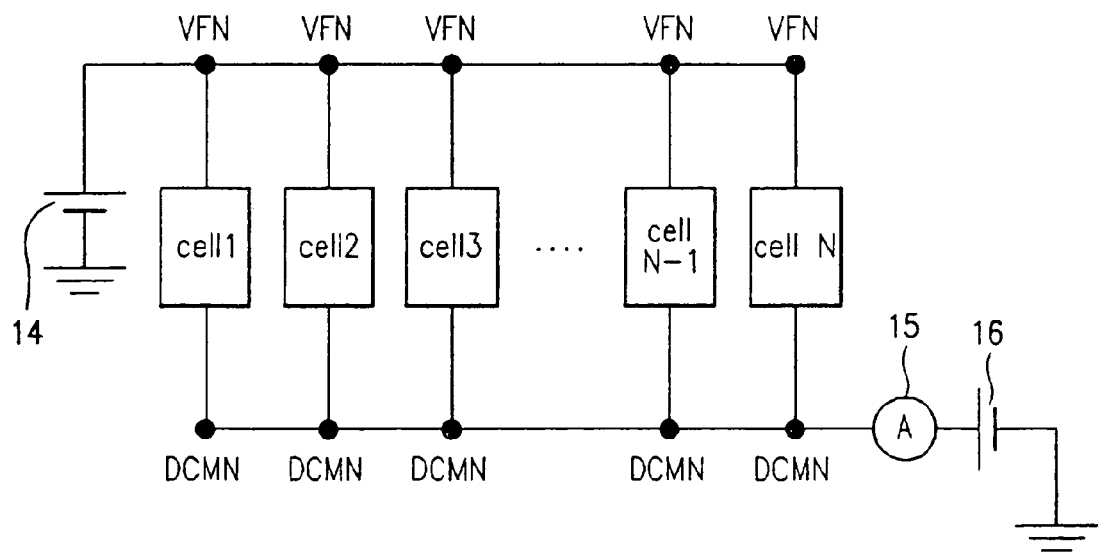
FIG. 5 illustrates an entire circuit showing a TDDB test pattern circuit of the present invention.
Figure 6:
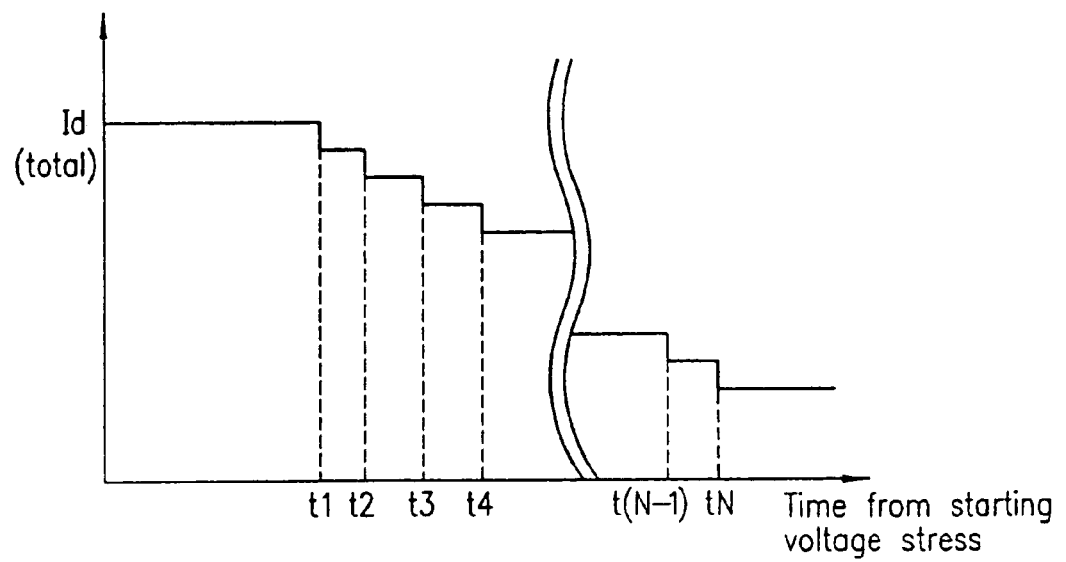
FIG. 6 illustrates a graph showing an experimental data of TDDB of an MOS capacitor dielectric film measured using FIG. 5.

And, referring to FIG. 5, an overall circuit of a TDDB test pattern circuit, i.e., a main test pattern circuit includes N of unit test pattern cells connected in parallel between the constant voltage applying electrode 14 and the ammeter 15. That is, the VFN of each unit test pattern cell is connected to the constant voltage applying electrode 14 and the DCMNs of unit test pattern cells are connected in parallel. And, like the TDDB test pattern of a unit test pattern cell in FIG. 3, the main test pattern includes only one of each, constant voltage applying electrode 14, ammeter 15 and drain voltage applying electrode 16. In this instance, the ammeter 15 measures the sum of drain currents from the MOS transistor 12 in each unit test pattern circuit cell.

Figure 7:
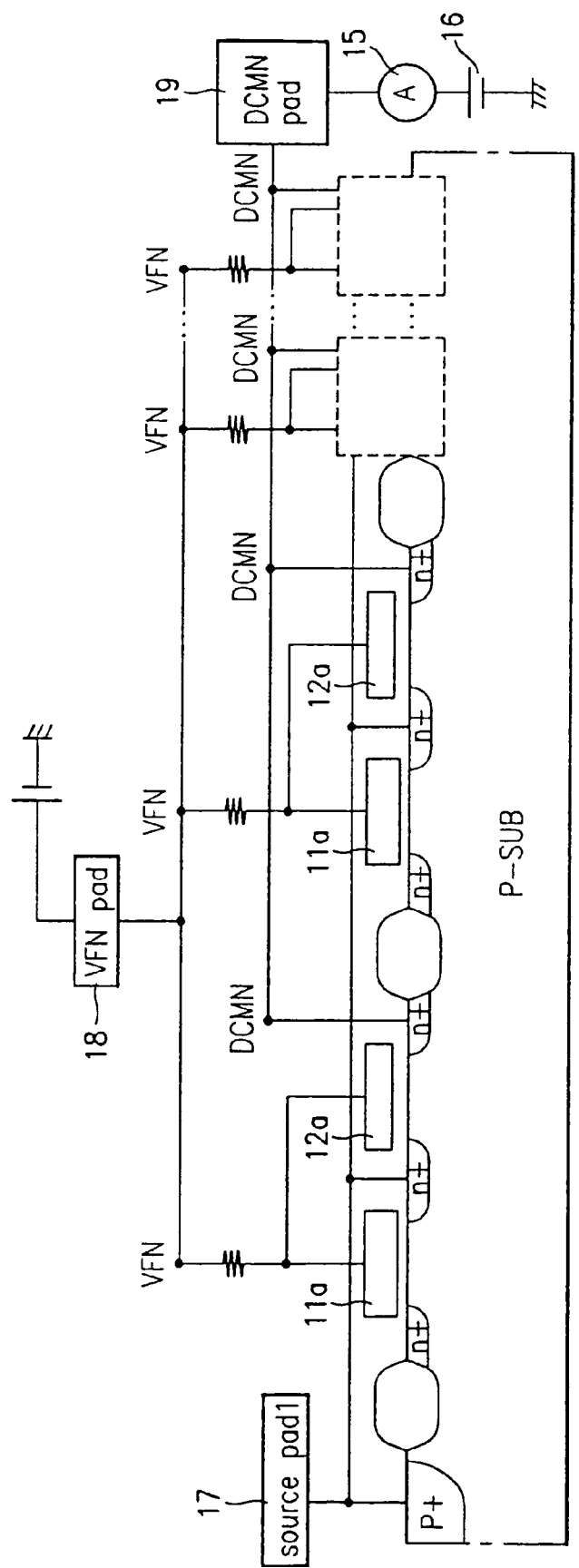
FIG. 7 illustrates a section showing a TDDB test pattern circuit in accordance with a first preferred embodiment of the present invention; and, FIG. 8 illustrates a section showing a TDDB test pattern circuit in accordance with a second preferred embodiment of the present invention.

The TDDB test pattern of the present invention having the foregoing circuit will be explained with reference to embodiments of the present invention. FIG. 7 shows a first embodiment where a voltage stress is applied to a dielectric film in an MOS capacitor 11 in an inversion mode. In this case, the type of the MOS transistor 12 is the same type as the MOS capacitor 11. For example, as shown in FIG. 7, if the MOS capacitor 11 is an NMOS type, the MOS transistor 12 is also NMOS. And, when the voltage stress is to be applied in the inversion mode, additional source and drain is formed in the MOS capacitor 11.

Figure 8:
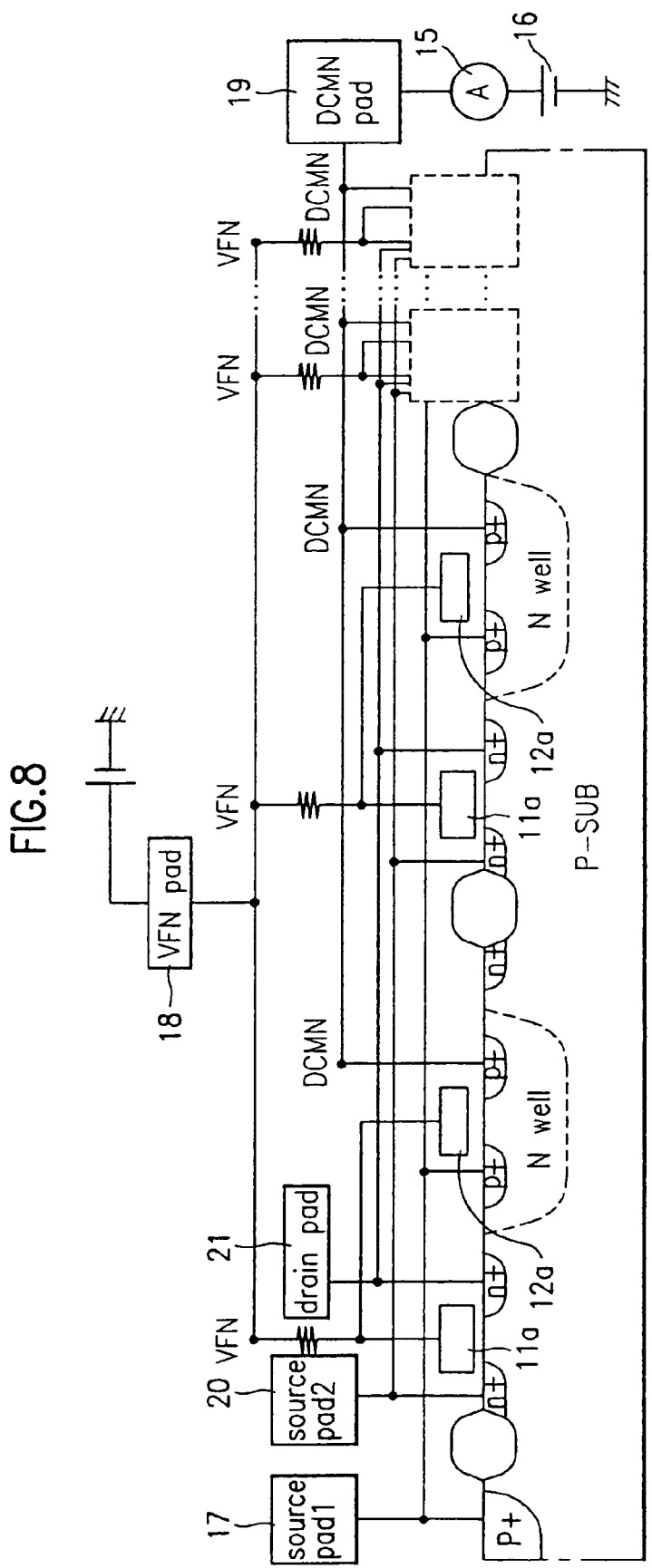

FIG. 8 shows a second embodiment where the voltage stress is applied to a dielectric film in an MOS capacitor 11 in an accumulation mode. In this case, the type of the MOS transistor 12 should be that opposite to that of the MOS capacitor 11. For example, as shown in FIG. 8, if the MOS capacitor 11 is an NMOS type, the MOS transistor 12 should be PMOS transistor.

Also, as shown in FIGS. 7 and 8, the main test pattern includes four input/output pads including a substrate pad (not shown) for connecting the MOS capacitor 11 and a bulk electrode of the MOS transistor 12 in each unit test pattern cell, a source pad 17 for connecting source electrodes of the MOS transistors 12, a VFN pad 18 for connecting VFNs of unit test cells, and a DCMN pad 19 for connecting the DCMN connected to the drain electrode of the MOS transistor 12 in each unit test pattern cell. In the accumulation mode, two more pads are provided to be connected to the source and the drain of the MOS capacitor because types of the MOS capacitor and the MOS transistor are opposite, for a total of six input/output pads the test pattern circuit.

Test conditions for improved testing will be explained before explaining a method for testing a TDDB of a MOS capacitor dielectric film using the aforementioned TDDB test pattern circuits of the present invention. A first condition for improved testing using the TDDB test pattern circuits is to form the gate dielectric film of the MOS transistor 12 thicker than a thickness of a dielectric film of the MOS capacitor 11. The second condition to dope the gate electrode of the MOS transistor 12 lighter than the MOS capacitor 11. If the gate oxide film of the MOS transistor 12 is thicker than the dielectric film of the MOS capacitor 11, the gate oxide film of the MOS transistor 12 operates normally without being influenced from the voltage stress during a time period before the dielectric film in the MOS capacitor 11 breaks due to the voltage stress, because the Tbd is sensitive to the thickness of the dielectric film; a small increase of the thickness of the dielectric film increases the Tbd significantly under the same voltage stress condition.

Also, the light doping of the gate electrode of the MOS transistor 12 causes a voltage significantly lower than the $V_{force}$ to be applied to the gate oxide film due to depletion of the gate electrode. In this instance, because the voltage stress is low, the Tbd of the MOS transistor 12 is increased significantly even if the thicknesses of the dielectric film of the MOS capacitor 11 and the gate oxide film of the MOS transistor are the same. Therefore, the MOS transistor 12 operates normally because the gate oxide film of the MOS transistor 12 has very little stress exerted thereon until a breakdown of the dielectric film in the MOS capacitor 11 occurs due to the voltage stress.

Next, a method for testing a TDDB of a dielectric film in the MOS capacitor 11 using the TDDB test pattern circuit will be explained.

Figure 1:
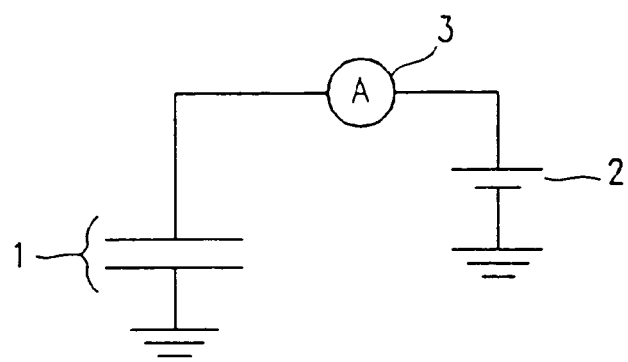
FIG. 1 illustrates a unit circuit showing a related art TDDB test pattern circuit.
Figure 2:
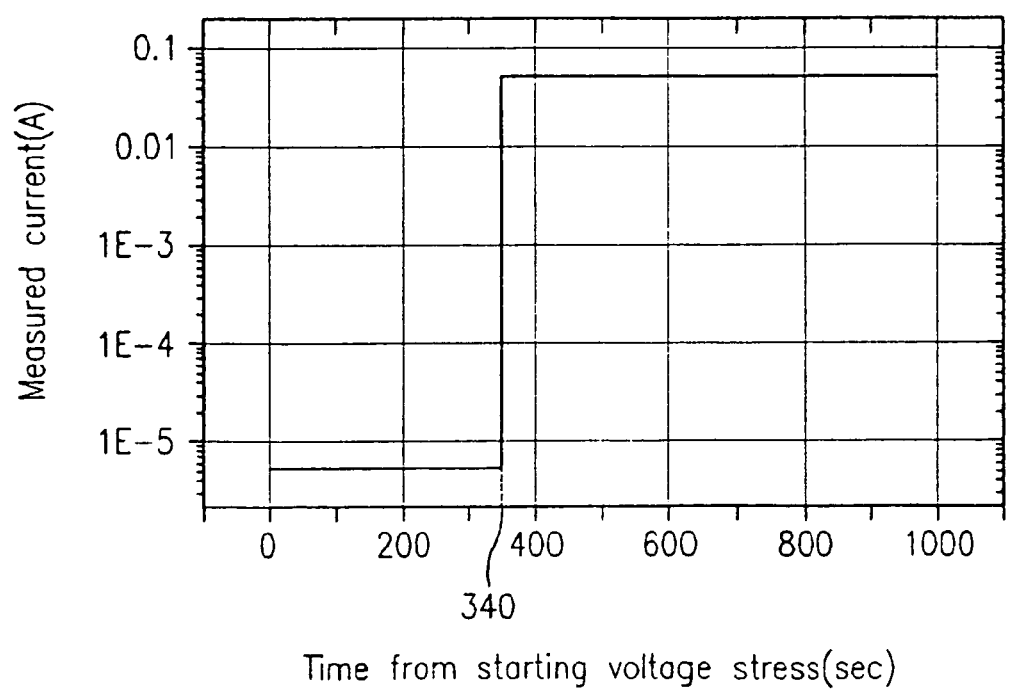
FIG. 2 illustrates a graph showing an experimental data of TDDB of an MOS capacitor dielectric film measured using FIG. 1.

Referring to FIG. 8, a constant voltage $V_{force}$ is applied to the MOS capacitor 11 and the MOS transistor 12 in the unit test pattern cell 10 from the constant voltage applying electrode 14. In this instance, there is a leakage current flowing through the dielectric film of the MOS capacitor 11 and the gate oxide film of the MOS transistor 12. However, the ohmic voltage drop of the fuse 13 negligible, because the leakage current is very low. Thereafter, as explained before, the voltage stress causes a breakdown only on the dielectric film of the MOS capacitor for the testing time period causing a large current flowing through the fuse 13.(see FIG. 2). This current generates a Joule's heat against a resistance of the fuse 13, which breaks the fuse 13. Consequently, no more voltage stress $V_{force}$ is applied to the gate electrode of the MOS transistor 12. The dielectric film in the MOS capacitor 11 loses its capacitive characteristic after the breakdown, and a ground voltage is applied to the gate electrode of the MOS transistor 12 through the MOS capacitor 11. Accordingly, the MOS transistor 12 turns off and the current flowing to the drain electrode drops suddenly due to a voltage change($V_{force}{}^30$) at the gate. That is, the breakdown of the dielectric film of the MOS capacitor 11 is directly measured as the drain current drop of the MOS transistor 12. In this instance, the voltage applied to the drain of the MOS transistor 12 may be in either a linear region or a saturation region, a low voltage is favored when taking a possibility of performance degradation of the MOS transistor 12 caused by a hot carrier effect and a reliability into account.

As shown in FIG. 4, Tbd characteristics of such a unit test pattern cell exhibits a sudden drop of a drain current Id after a time period 't' when $V_{force}>0$ is applied as the stress to the unit test pattern cell of the first embodiment, and when $V_{force}<0$ is applied as the stress to the unit test pattern cell of the second embodiment. The time period 't', being a time period required for a change of the drain current(Id), is a Tbd(Time to breakdown) of the dielectric film in the MOS capacitor 11.

Next, a method for testing a TDDB using the main test pattern circuit having N unit test pattern cells connected in parallel will be explained.

As shown in FIG. 5, constant voltage $V_{force}$ is applied to each of the N unit test pattern cells through respective VFN from the constant voltage applying electrode 14. In this instance, the constant voltage $V_{force}$ is applied to the MOS capacitor 11 and the MOS transistor 12 in each unit test pattern cell simultaneously. Thereafter, each unit test pattern cell operates as the unit test pattern cell explained above regardless of operations of other cells. A TDDB test operation of the main test pattern having N unit test pattern circuit cells proceeds by measuring times at each of which a sum of the drain currents from the N MOS transistors are reduced following a breakdown an the dielectric film of each MOS capacitor. That is, upon breakdown of arbitrary MOS capacitor of the N unit test pattern cells, the sum of the drain currents from entire MOS transistors is reduced.

FIG. 6 illustrates a result expected change of the sum(Id (total)) of the drain currents along a time axis. As shown at times t1, t2, t3, - - - , tN at which the sum of the drain currents is reduced represents a Tbd of an arbitrary dielectric film in the MOS capacitor. The tN, representing a maximum time period tmax required for testing all the N unit test pattern cells, is the Tbd of the unit test pattern cell which takes the longest breakdown.

The TDDB test pattern and the method for testing TDDBs of MOS capacitor dielectric films using the same have the following advantages.

First, the time period required for testing all the N unit test pattern cells is a Tbd of the unit test pattern cell which takes the longest to breakdown. Therefore, in a case where numerous cells are involved, the time required for measuring the same can be reduced substantially.

Second, the reduction of testing time reduces measuring cost.

Third, from a statistical perspective, a substantially greater data can be obtained, which improves a precision of the measurement result in view of statistics.

It will be apparent to those skilled in the art that various modifications and variations can be made in the TDDB test pattern circuit and the method for testing TDDBs of MOS capacitor dielectric films using the same of the present invention without departing from the spirit or scope of the invention. Thus, it is intended that the present invention cover the modifications and variations of this invention provided they come within the scope of the appended claims and their equivalents.

What is claimed is:

1. A method for testing Time Dependent Dielectric Breakdowns (TDDBs) of metal-oxide-semiconductor (MOS) capacitor dielectric films using a TDDB test pattern, the method comprising:
   providing a plurality of unit test pattern cells between a first node and a second node, each of the unit test pattern cells including a fuse coupled between the first node and a third node, a MOS capacitor coupled between the third node and a ground, and a MOS transistor coupled between the ground and the second node, wherein a gate of the MOS transistor is coupled to the third node;
   applying a first voltage to the first node and applying a second voltage to the second node and providing an ammeter between the second node and a second voltage supplying unit that supplies the second voltage; and
   measuring a total drain current using the ammeter.

2. A method as claimed in claim 1, wherein the MOS transistor is an N type when the MOS capacitor is the N type.

3. A method as claimed in claim 2, wherein the first voltage is higher than zero (0) volt when the MOS transistor and the MOS capacitor are the N type.

4. A method as claimed in claim 1, wherein the MOS transistor is an N type when the MOS capacitor is a P type.

5. A method as claimed in claim 4, wherein the first voltage is lower than zero (0) volt when the MOS transistor is the N type while the MOS capacitor is the P type.

* * * * *